(12) United States Patent
Gay et al.

(10) Patent No.: US 12,199,131 B2
(45) Date of Patent: Jan. 14, 2025

(54) BACK-SIDE ILLUMINATED IMAGE SENSOR

(71) Applicant: STMicroelectronics (Crolles 2) SAS, Crolles (FR)

(72) Inventors: Laurent Gay, Lumbin (FR); Frederic Lalanne, Bernin (FR); Yann Henrion, Fontaine (FR); Francois Guyader, Montbonnot (FR); Pascal Fonteneau, Theys (FR); Aurelien Seignard, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 31 days.

(21) Appl. No.: 17/855,521

(22) Filed: Jun. 30, 2022

(65) Prior Publication Data

US 2022/0336520 A1    Oct. 20, 2022

Related U.S. Application Data

(62) Division of application No. 16/740,050, filed on Jan. 10, 2020, now Pat. No. 11,398,521.

(30) Foreign Application Priority Data

Jan. 14, 2019  (FR) ...................................... 1900323

(51) Int. Cl.
*H01L 27/146*      (2006.01)

(52) U.S. Cl.
CPC .... *H01L 27/14683* (2013.01); *H01L 27/1463* (2013.01); *H01L 27/14636* (2013.01);
(Continued)

(58) Field of Classification Search
CPC .......... H01L 27/1463; H01L 27/14636; H01L 27/1464; H01L 27/14603; H01L 27/14623; H01L 27/14625
See application file for complete search history.

(56) References Cited

U.S. PATENT DOCUMENTS 8,552,516 B2    10/2013  Murakoshi et al.
9,209,320 B1    12/2015  Webster
(Continued)

FOREIGN PATENT DOCUMENTS

CN    101533767 A    9/2009
CN    102651375 A    8/2012
(Continued)

*Primary Examiner* — Tucker J Wright
(74) *Attorney, Agent, or Firm* — Seed IP Law Group LLP

(57) ABSTRACT

Image sensors and methods of manufacturing image sensors are provided. One such method includes forming a structure that includes a semiconductor layer extending from a front side to a back side, and a capacitive insulation wall extending through the semiconductor layer. The capacitive insulation wall includes first and second insulating walls separated by a region of a conductor or a semiconductor material. Portions of the semiconductor layer and the region of the conductor or semiconductor material are selectively etched, and the first and second insulating walls have portions protruding outwardly beyond a back side of the semiconductor layer and of the region of the conductor or semiconductor material. A dielectric passivation layer is deposited on the back side of the structure, and portions of the dielectric passivation layer are locally removed on a back side of the protruding portions of the first and second insulating walls.

17 Claims, 5 Drawing Sheets

(52) U.S. Cl.
CPC .... *H01L 27/1464* (2013.01); *H01L 27/14685* (2013.01); *H01L 27/14692* (2013.01)

(56) References Cited

U.S. PATENT DOCUMENTS

| | | |
|---|---|---|
| 9,570,494 B1 | 2/2017 | Jerome et al. |
| 11,031,433 B2 | 6/2021 | Lalanne et al. |
| 2004/0108587 A1 | 6/2004 | Chudzik et al. |
| 2006/0001174 A1 | 1/2006 | Matsui |
| 2008/0113505 A1 | 5/2008 | Sparks et al. |
| 2008/0173993 A1 | 7/2008 | Andry et al. |
| 2009/0267183 A1 | 10/2009 | Temple et al. |
| 2010/0032808 A1 | 2/2010 | Ding et al. |
| 2010/0041203 A1 | 2/2010 | Collins et al. |
| 2010/0155796 A1 | 6/2010 | Koike et al. |
| 2010/0230806 A1 | 9/2010 | Huang et al. |
| 2010/0264544 A1 | 10/2010 | Heo et al. |
| 2012/0133010 A1 | 5/2012 | Komukai |
| 2012/0133021 A1 | 5/2012 | Joblot et al. |
| 2012/0261783 A1* | 10/2012 | Prima ................ H01L 27/1464 257/447 |
| 2013/0105928 A1 | 5/2013 | Costello et al. |
| 2015/0279878 A1 | 10/2015 | Ahmed et al. |
| 2016/0099274 A1 | 4/2016 | Vora |
| 2018/0012823 A1 | 1/2018 | Chen et al. |
| 2018/0166475 A1 | 6/2018 | Chen et al. |

FOREIGN PATENT DOCUMENTS

| | | |
|---|---|---|
| CN | 103545325 A | 1/2014 |
| CN | 105702690 A | 6/2016 |
| CN | 107507842 A | 12/2017 |
| FR | 2974237 A1 | 10/2012 |
| JP | H0897367 A | 4/1996 |
| JP | 2008270365 A | 11/2008 |
| JP | 2016111285 A | 6/2016 |

* cited by examiner

BACK-SIDE ILLUMINATED IMAGE SENSOR

TECHNICAL FIELD

The present disclosure concerns a back-side illuminated image sensor and a method of manufacturing such a sensor.

DESCRIPTION OF THE RELATED ART

A back-side illuminated image sensor conventionally comprises a semiconductor layer having a surface, called front side, coated with a stack of insulating and conductive layers forming an interconnection structure, and having its side opposite to the front side, called back side, intended to receive an illumination originating from a scene, an image of which is desired to be acquired. The sensor comprises a plurality of pixels, for example, arranged in an array, formed inside and on top of the semiconductor layer. Each pixel particularly comprises a photodetection area formed in the semiconductor layer, and one or a plurality of control transistors formed inside and on top of the semiconductor layer, on the front side of the semiconductor layer. The pixels are interconnected via the interconnection structure.

BRIEF SUMMARY

In, an embodiment, the present disclosure provides a method of manufacturing an image sensor that includes: forming a structure having a front side and a back side, the structure including a semiconductor layer extending from the front side to the back side of the structure and a capacitive insulation wall extending through the semiconductor layer from the front side to the back side of the structure, the capacitive insulation wall including first and second insulating walls separated by a region of a conductor or semiconductor material; selectively etching, from the back side of said structure, portions of the semiconductor layer and the region of the conductor or semiconductor material, each of the first and second insulating walls having a portion protruding outwardly beyond a back side of the semiconductor layer and a back side of the region of the conductor of semiconductor material after the etching; depositing a dielectric passivation layer on the back side of the structure; and locally removing portions of the dielectric passivation layer on a back side of the protruding portions of the first and second insulating walls.

According to an embodiment, the locally removing portions of the dielectric passivation layer includes depositing a sacrificial layer on the dielectric passivation layer, and thinning the sacrificial layer to reach the back side of the protruding portions of the first and second insulating walls.

According to an embodiment, the locally removing portions of the dielectric passivation layer further includes removing portions of the sacrificial layer remaining after the thinning the sacrificial layer.

According to an embodiment, the sacrificial layer is made of silicon nitride.

According to an embodiment, the method further includes depositing an antireflection layer on a back side of the dielectric passivation layer and on the back side of the protruding portions of the first and second insulating walls after the locally removing portions of the dielectric passivation layer.

According to an embodiment, the method includes depositing an antireflection layer on a back side of the dielectric passivation layer, and locally removing portions of the antireflection layer on the back side of the protruding portions of the first and second insulating walls.

According to an embodiment, the antireflection layer comprises tantalum oxide.

According to an embodiment, the dielectric passivation layer comprises a dielectric material having a dielectric constant greater than that of silicon oxide, aluminum oxide or hafnium oxide.

According to an embodiment, the method includes oxidizing the back side of the semiconductor layer after the forming the structure and before the selectively etching the portions of the semiconductor layer and the region of the conductor or semiconductor material.

According to an embodiment, the semiconductor layer is made of single-crystal silicon, the region of the conductor or semiconductor material is made of polysilicon or amorphous silicon, and the first and second insulating walls are made of silicon oxide.

According to an embodiment, the capacitive insulation wall comprises a third insulating wall separating the region of the conductor or semiconductor material into two distinct walls.

According to an embodiment, the structure comprises an interconnection structure coating a front side of the semiconductor layer.

Another embodiment provides an image sensor comprising a semiconductor layer having a front side and a back side, and a capacitive insulation wall extending from the front side to the back side of the semiconductor layer, the capacitive insulation wall comprising first and second insulating walls separated by a region of a conductor or semiconductor material. Each of the first and second insulating walls has a portion protruding from the back side of the semiconductor layer and from a back side of the region of the conductor or semiconductor material. A dielectric passivation layer coats the back side of the semiconductor layer and the back side of the region of the conductor or semiconductor material, and a back side of the protruding portions of the first and second insulating walls is uncoated by the dielectric passivation layer.

According to an embodiment, the image sensor further comprises an antireflection layer coating a back side of the dielectric passivation layer and the back side of the protruding portions of the first and second insulating walls.

According to an embodiment, the sensor further comprises an antireflection layer coating a back side of the dielectric passivation layer, and the back side of the protruding portions of the first and second insulating walls is uncoated by the antireflection layer.

The foregoing and other features and advantages will be discussed in detail in the following non-limiting description of specific embodiments in connection with the accompanying drawings.

DETAILED DESCRIPTION

Figure 1:
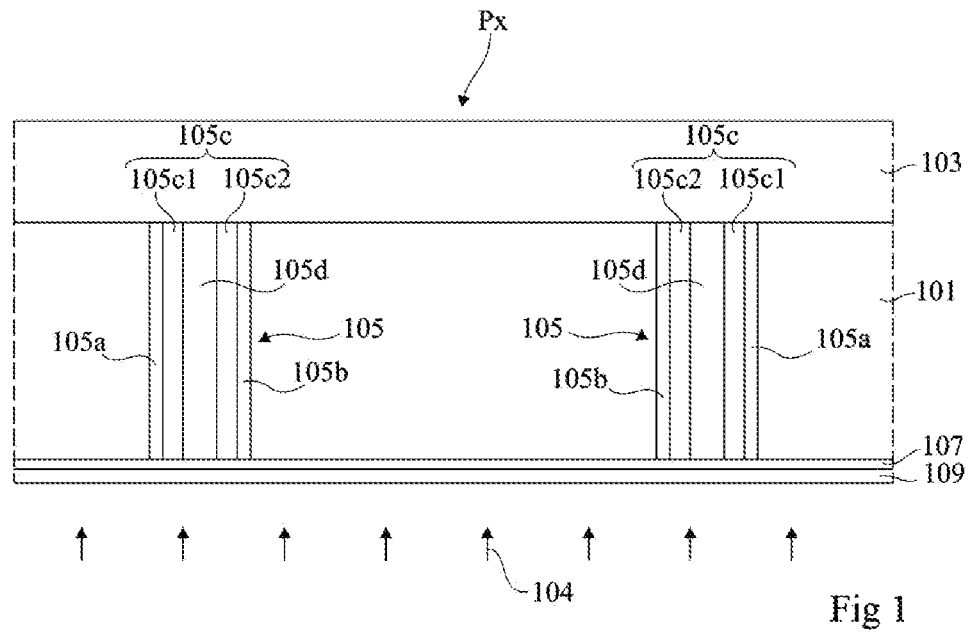
FIG. 1 is a partial simplified cross-section view of an example of a back-side illuminated image sensor.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the forming of the photodetection areas and of the transistors for controlling the pixels of the described sensors has not been detailed, the described embodiments being compatible with usual structures of pixels of back-side illuminated sensors.

Throughout the present disclosure, the term "connected" is used to designate a direct electrical connection between circuit elements with no intermediate elements other than conductors, whereas the term "coupled" is used to designate an electrical connection between elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", "lateral", etc., or to terms qualifying directions, such as terms "horizontal", "vertical", etc., unless otherwise specified, it is referred to the orientation of the drawings, it being understood that, in practice, the described devices may be oriented differently.

The terms "about", "substantially", "approximately", and "in the order of" are used herein to designate a tolerance of plus or minus 10%, preferably of plus or minus 5%, of the value in question.

FIG. 1 is a partial simplified cross-section view of an example of a back-side illuminated image sensor. The sensor of FIG. 1 comprises a semiconductor layer 101, for example, made of single-crystal silicon. The sensor of FIG. 1 further comprises an interconnection structure 103 coating the upper surface or front side of semiconductor layer 101. The sensor of FIG. 1 comprises a plurality of pixels Px formed inside and on top of semiconductor layer 101. Each pixel Px comprises at least one photosensitive area (not detailed) formed in semiconductor layer 101, and one or a plurality of control transistors (not detailed) formed inside and on top of conductive layer 101. Pixels 101 are interconnected by conductive tracks (not detailed) formed in interconnection structure 103. In operation, the sensor is illuminated on its lower surface or back side, that is, on its side opposite to interconnection structure 103, as illustrated by arrows 104 of FIG. 1.

Sensors of the type illustrated in FIG. 1, comprising capacitive insulation walls 105 vertically extending through semiconductor layer 101, from the front side and to the back side of layer 101, are here more particularly considered. As an example, in each pixel, the photosensitive area of the pixel is totally surrounded, in top view, by a ring-shaped capacitive insulation wall 105. Each capacitive insulation wall 105 comprises two vertical insulating walls 105a and 105b, separated by a vertical conductor or semiconductor region 105c, for example, made of polysilicon or of amorphous silicon. Regions 105a, 105b, and 105c for example each extend across the entire thickness of semiconductor layer 101, from the front side to the back side of layer 101. Each of insulating walls 105a and 105b has an outer lateral surface in contact with semiconductor layer 101 and an inner lateral surface in contact with region 105c. As an example, insulating walls 105a and 105b are made of silicon oxide. In the shown example, each capacitive insulation wall 105 further comprises a central insulating wall 105d, for example, made of silicon oxide, extending along the entire height of the wall and separating conductor or semiconductor region 105c in two separate walls 105c1 and 105c2.

As an example, the thickness of semiconductor layer 101, and thus the height of walls 105, is in the range from 1 to 20 µm, for example, from 2 to 10 µm. Conductor or semiconductor regions 105c1 and 105c2 for example each have a width in the range from 10 to 100 nm, for example, in the order of 50 nm. Central insulating region 105d for example has a width in the range from 10 to 200 nm, for example, in the order of 50 nm. Outer insulating regions 105a and 105b for example each have a width in the range from 5 to 40 nm, for example, in the order of 15 nm.

In each capacitive insulation wall 105, the conductor or semiconductor wall 105c1 and/or 105c2 of the wall may be electrically connected, by its front side, to a terminal of application of a bias potential (not detailed in the drawing) formed in interconnection structure 103, which enables to bias the capacitance formed between semiconductor layer 101 and wall 105c1 and/or the capacitance formed between semiconductor layer 101 and wall 105c2 during the sensor operation.

On the back side of the sensor, a passivation layer 107 made of a dielectric material, continuously extending over substantially the entire rear surface of the sensor, that is, on the back side of semiconductor layer 101 and on the back side of capacitive insulation walls 105, is provided. Layer 107 is for example made of a material different from the material of insulating walls 105a and 105b. As an example, layer 107 is made of a material having a high dielectric constant, that is, having a dielectric constant greater than that of silicon oxide, for example, hafnium oxide ($HfO_2$) or aluminum oxide ($Al_2O_3$).

In the example of FIG. 1, the sensor further comprises an antireflection layer 109, for example, made of tantalum oxide ($Ta_2O_5$), coating the back side of passivation layer 107.

According to the needs of the application, other layers, not shown, may be provided on the back side of the sensor, for example, a silicon oxide protection layer, a filtering layer made of colored resin, a layer of microlenses, etc.

To form the sensor of FIG. 1, it may be started form a relatively thick initial substrate, for example, made of silicon, having its upper portion formed by semiconductor layer 101 of the sensor.

Pixels Px, capacitive insulation walls 105, and interconnection structure 103 are then formed inside and on top of semiconductor layer 101, from the front side of the substrate.

A support handle is then affixed onto the upper surface of interconnection structure 103, after which the substrate is thinned from its lower surface or back side, for example by grinding and/or by chemical thinning, possibly followed by a step of planarization or chemical-mechanical polishing (CMP), until the back side of semiconductor layer 101 and of capacitive insulation walls 105 is reached.

Passivation layer 107, as well as the possible additional back side layers of the sensor (antireflection layer 109 in the example of FIG. 1) are then deposited on the back side of semiconductor layer 101 and of capacitive insulation walls 105.

The support handle attached to the front side of interconnection structure 103 may then be removed. As a variation, the support handle may be kept as a mechanical support until the end of the method (and possibly in the final product). As a variation, the support handle may comprise an integrated circuit comprising transistors for controlling the sensor pixels.

In practice, it can be observed that the capacitance formed between conductor or semiconductor wall $105c1$ and semiconductor layer 101 (separated by insulating wall $105a$), and the capacitance formed between conductor or semiconductor wall $105c2$ and semiconductor layer 101 (separated by insulating wall $105b$) have relatively low breakdown voltages. As an example, when the thickness of insulating walls $105a$ and $105b$ is selected to obtain a theoretical breakdown voltage of 20 V between region $105c1$ and region 101 and between region $105c2$ and region 101, it can be observed, in practice, that the real breakdown voltage of the capacitances is approximately 10 V. Beyond this voltage, breakdowns are capable of occurring in the vicinity of the lower surface of walls $105a$ and $105b$.

To solve this problem, after the step of thinning substrate 101 from its back side, and before the step of depositing dielectric passivation layer 107, a step of partial etching, from the back side, of semiconductor layer 101 and of conductor or semiconductor regions $105c1$ and $105c2$, selectively over insulating regions $105a$, $105b$, and $105d$, may be provided.

At the end of this etch step, insulating layers $105a$, $105b$, and $105d$ of walls 105 have portions protruding from the back side of semiconductor layer 101 and from the back side of conductor or semiconductor regions $105c1$ and $105c2$.

Passivation layer 107 is then deposited on the back side of semiconductor layer 101 and on the back side of conductor or semiconductor regions $105c1$ and $105c2$, as well as on the back side and on the sides of the protruding portions of insulating regions $105a$, $105b$, and $105d$.

The possible additional back side layers of the sensor may then be deposited on the back side of layer 107.

Figure 2:
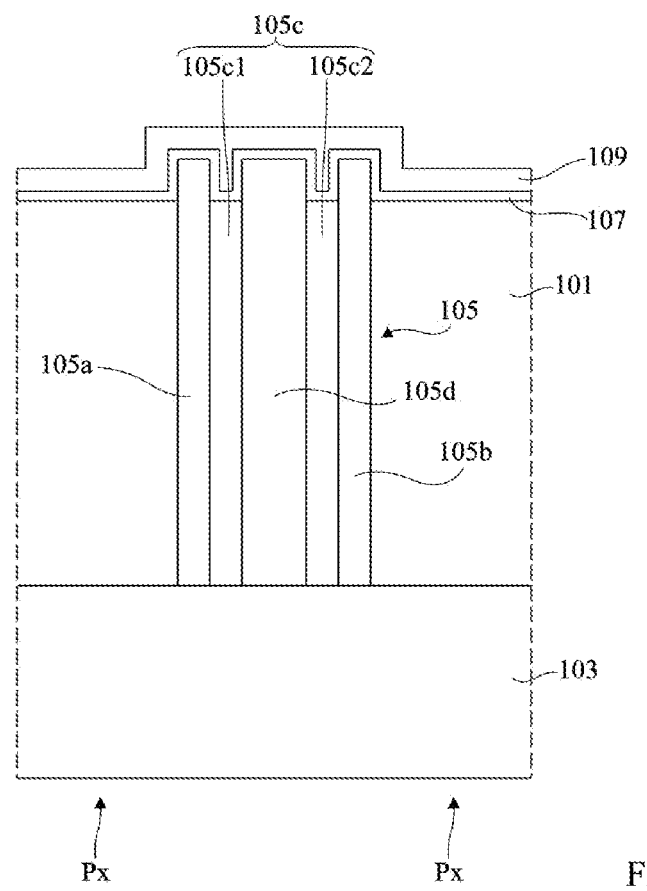
FIG. 2 is a partial simplified cross-section view of another example of a back-side illuminated image sensor.

FIG. 2 is a partial simplified cross-section view illustrating an example of a back-side illuminated image sensor obtained by this method. FIG. 2 shows an enlargement of a portion of the sensor, centered on a vertical capacitive insulation wall 105 of the sensor. In FIG. 2, the orientation of the sensor is inverted with respect to FIG. 1. In other words, in FIG. 2, the back side (or illumination surface) of the sensor corresponds to its upper surface, and the front side of the sensor corresponds to its lower surface.

An advantage of the manufacturing method described in relation with FIG. 2 and of the sensor obtained by this method is a significant improvement of the breakdown voltage of capacitive insulation walls 105. Such an improvement can in particular be explained by the increase of the electric path between semiconductor layer 101 and conductor or semiconductor region $105c1$ or $105c2$, via the interface between insulating walls $105a$ or $105b$ and passivation layer 107.

As an example, for identical dimensions, and particularly for a same thickness of insulating walls $105a$ and $105b$ of walls 105, an improvement by a factor two of the breakdown voltage of the capacitances formed between region $105c1$ and layer 101 on the one hand, and between region $105c2$ and layer 101 on the other hand, can be observed.

It would however be desirable to at least partly improve certain aspects of back-side illuminated image sensors of the type described in relation with FIG. 2.

FIGS. 3, 4, 5, 6, 7, 8, 9, and 10 are partial simplified cross-section views illustrating steps of an example of a method of manufacturing a back-side illuminated image sensor according to an embodiment. While the steps of the manufacturing method are described sequentially with respect to FIGS. 3 through 10, it will be readily appreciated that in various embodiments, the steps may be performed in any suitable sequence.

The sensor of FIGS. 3 to 10 comprises elements common with the sensors of FIGS. 1 and 2. These elements will not be detailed again hereafter. Hereafter, only the differences with the sensors of FIGS. 1 and 2 will be highlighted. It should be noted that the cross-section views of FIGS. 3 to 10 have the same orientation as the cross-section view of FIG. 2 and show an enlargement of an upper portion of the sensor, centered on a vertical capacitive insulation wall 105 of the sensor.

Figure 3:
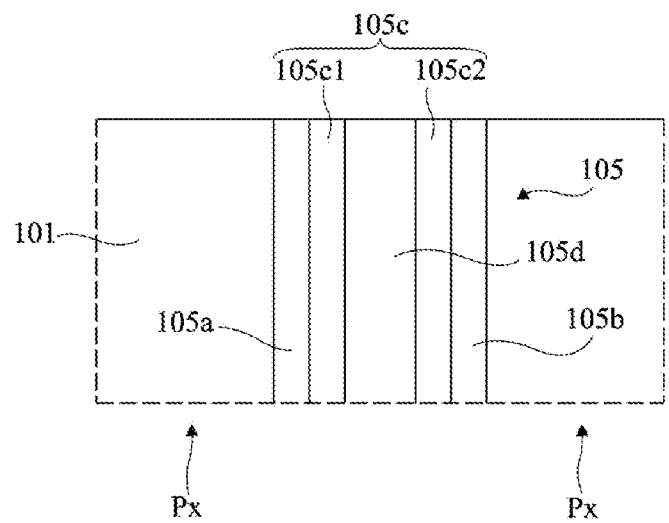
FIG. 3 illustrates a step of a method of manufacturing of a back-side illuminated image sensor according to an embodiment.

FIG. 3 illustrates an initial step of forming a structure comprising semiconductor layer 101 and capacitive insulation walls 105 extending vertically from the front side (lower surface in the orientation of FIGS. 3 to 10, not shown in FIGS. 3 to 10) to the back side (upper surface in the orientation of FIGS. 3 to 10) of semiconductor layer 101. To form this structure, one may, as in the previously-described examples, start from a relatively thick initial substrate, for example, made of silicon, having its front portion formed by semiconductor layer 101. Pixels Px, capacitive insulation walls 105, and interconnection structure 103 (not shown in FIGS. 3 to 10) are then formed inside and on top of semiconductor layer 101, from the front side of the substrate. A support handle (not shown) is then affixed to the front side of interconnection structure 103 (that is, the surface of interconnection structure 103 opposite to the substrate), after which the substrate is thinned from its back side, for example, by grinding, to reach the back side of semiconductor layer 101 and of capacitive insulation walls 105. The substrate thinning step may in particular comprise a step of chemical-mechanical planarization or polishing (CMP) aiming at obtaining, after thinning, a substantially planar rear surface. In other words, at the end of this step, capacitive insulation walls 105 of the sensor are flush with the level of the back side of semiconductor 101 to form a substantially planar rear surface.

Figure 4:
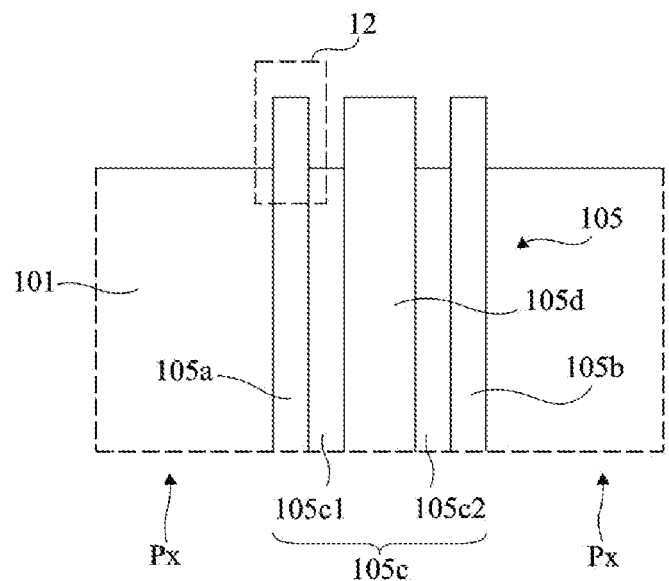
FIG. 4 illustrates another step of the manufacturing of a back-side illuminated image sensor according to an embodiment.

FIG. 4 illustrates a step of partial removal or recess of semiconductor layer 101 and of conductor or semiconductor regions 105c1 and 105c2, from the back side of the structure obtained at end of the steps of FIG. 3. During this step, the insulating regions 105a, 105b, and 105d of capacitive insulation walls 105 are kept. To achieve this, a partial etching of semiconductor layer 101 and of conductive or semiconductor regions 105c1 and 105c2, selectively over insulating regions 105a, 105b, and 105d, is performed from the back side of the structure obtained at the end of the steps of FIG. 3. Selective etching means that the speed at which the material(s) forming layer 101 and regions 105c1 and 105c2 (for example, silicon) are etched is greater, for example ten times greater, and preferably at least one hundred times greater, than the speed at which the material(s) forming regions 105a, 105b, and 105d (for example, silicon oxide) are etched. As an example, the etching implemented at the step of FIG. 4 is a plasma or dry etch step. As a variation, a wet etching may be used. The thickness of layer 101 and of regions 105c1 and 105c2 removed at the step of FIG. 4 is for example in the range from 5 to 200 nm, and preferably from 10 to 50 nm. As an example, the etching implemented at the step of FIG. 4 is a non-local etching, that is, semiconductor layer 101 and regions 105c1 and 105c2 are thinned across substantially the entire surface of the sensor Thus, at the end of the step of FIG. 4, on the back side of the structure, the conductor or semiconductor regions 105c1 of 105c2 of capacitive insulation walls 105 substantially stop at the same level as the back side of semiconductor layer 101. However, insulating layers 105a, 105b, and 105d of walls 105 have portions protruding from the back side of semiconductor layer 101 and from the back side of conductor or semiconductor regions 105c1 and 105c2.

At the end of the step of selective partial etching of layer 101 and of regions 105c1 and 105c2, a step of chemical cleaning of the back side of the sensor may be provided. During this step, a thin oxide layer (not shown), of native oxide or of chemical oxide, having a thickness in the order of 1 nm or less, may form on the back side of semiconductor layer 101 and on the back side of conductor and semiconductor regions 105c1 and 105c2. As a variation, a specific step of oxidizing the back side of semiconductor layer 101 may be provided to obtain a slightly ticker oxide layer, for example, having a thickness in the range from 1 to 5 nm.

Figure 5:
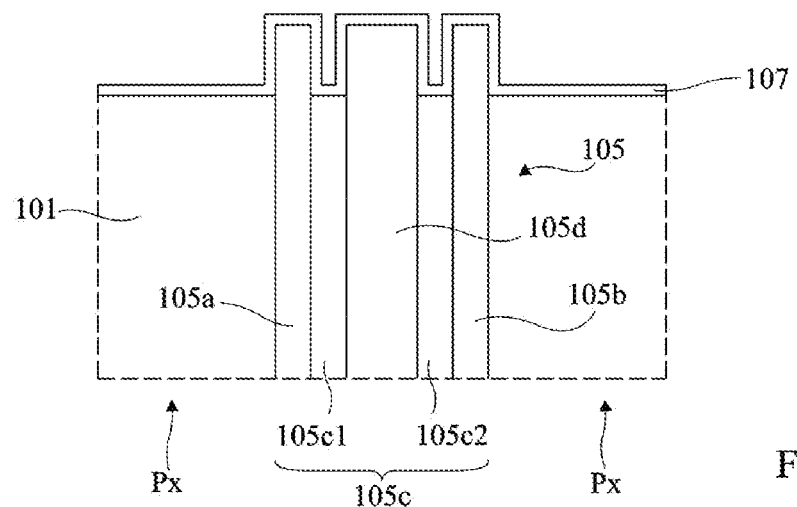
FIG. 5 illustrates another step of the manufacturing of a back-side illuminated image sensor according to an embodiment.

FIG. 5 illustrates a step of deposition of passivation layer 107 of the sensor, on top of and in contact with the back side of the structure obtained at the end of the steps of FIGS. 3 and 4. Layer 107 is for example deposited by atomic layer deposition (ALD). More generally, any other conformal deposition method may be used, so that layer 107 follows the shape of the relief formed by the protruding portions of insulating walls 105a, 105b, and 105d of walls 105. Passivation layer 107 is for example continuously deposited all over the rear surface of the sensor. The thickness of passivation layer 107 is for example smaller than the height of the protruding portions of insulating walls 105a, 105b, and 105d. As an example, the thickness of passivation layer 107 is in the range from 2 to 100 nm, for example, in the order of 13 nm.

Figure 6:
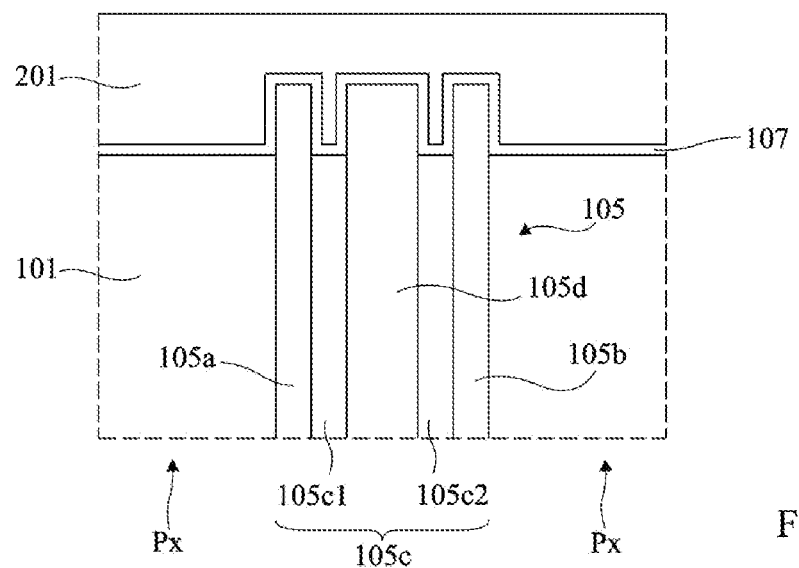
FIG. 6 illustrates another step of the manufacturing of a back-side illuminated image sensor according to an embodiment.

FIG. 6 illustrates a step of deposition of a sacrificial layer 201 on the upper surface of the structure obtained at the end of the steps of FIGS. 3, 4, and 5. Layer 201 is made of a material selectively etchable over the material of layer 107 (for example, hafnium oxide or aluminum oxide) and over the material of insulating walls 105a, 105b, and 105d (for example, silicon oxide). As an example, sacrificial layer 201 is made of silicon nitride, or resin, or of metal, for example, a metal from the group comprising copper, tungsten, and aluminum. As a variation, sacrificial layer 201 is made of silicon oxide deposited at low temperature to have a density lower than that of the silicon oxide of insulating walls 105a, 105b, and 105d and thus be selectively etchable over insulating walls 105a, 105b, and 105d. Sacrificial layer 201 is for example continuously deposited all over the rear surface of the sensor. The thickness of sacrificial layer 201 is for example selected to be greater than the height of the protruding portions of insulating walls 105a, 105b, and 105d. As an example, the thickness of sacrificial layer 201 is in the range from 10 to 200 nm, for example, in the order of 50 nm.

Figure 7:
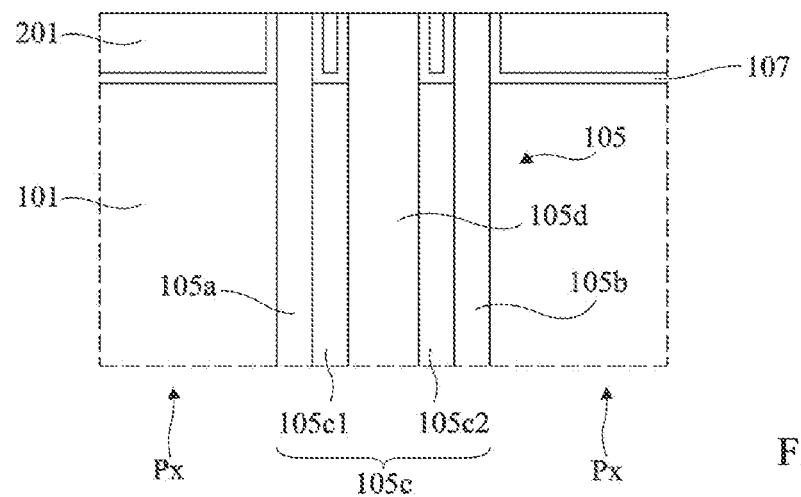
FIG. 7 illustrates another step of the manufacturing of a back-side illuminated image sensor according to an embodiment.

FIG. 7 illustrates a step of thinning, from the back side, the structure obtained at the end of the steps of FIGS. 3, 4, 5, and 6, for example, by chemical-mechanical planarization or polishing (CMP), to reach the back side of the insulating walls 105a, 105b, and 105d. The thinning is interrupted when the back side of the protruding portions of insulating walls 105a, 105b, and 105d is reached. Thus, at the end of this step, passivation layer 107 is interrupted opposite the back side of insulating walls 105a, 105b, and 105d. Passivation layer 107 is however kept opposite the back side of semiconductor layer 101 and of conductor or semiconductor regions 105c1 and 105c2, and on the sides of the protruding portions of insulating walls 105a, 105b, and 105d. At the end of this step, the back sides of insulating walls 105a, 105b, and 105d and of the portions of layer 107 coating the sides of insulating walls 105a, 105b, and 105d are flush with the back side of sacrificial layer 201, to form a substantially planar rear surface of the sensor.

Figure 8:
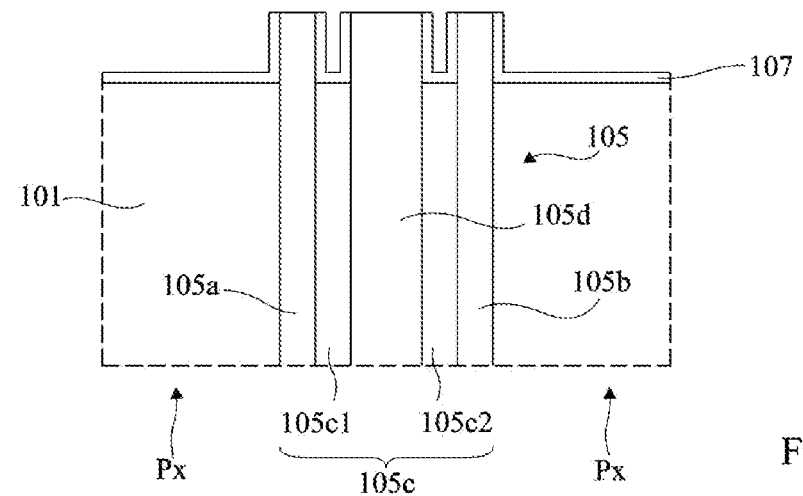
FIG. 8 illustrates another step of the manufacturing of a back-side illuminated image sensor according to an embodiment.

FIG. 8 illustrates a step of removing the portions of sacrificial layer 201 remaining opposite the back side of semiconductor layer 101 and conductor or semiconductor regions 105c1 and 105c2. During this step, sacrificial layer 201 is selectively removed over passivation layer 107 and over insulating walls 105a, 105b, and 105d. Sacrificial layer 201 may be removed by dry etching or by wet etching.

Figure 9:
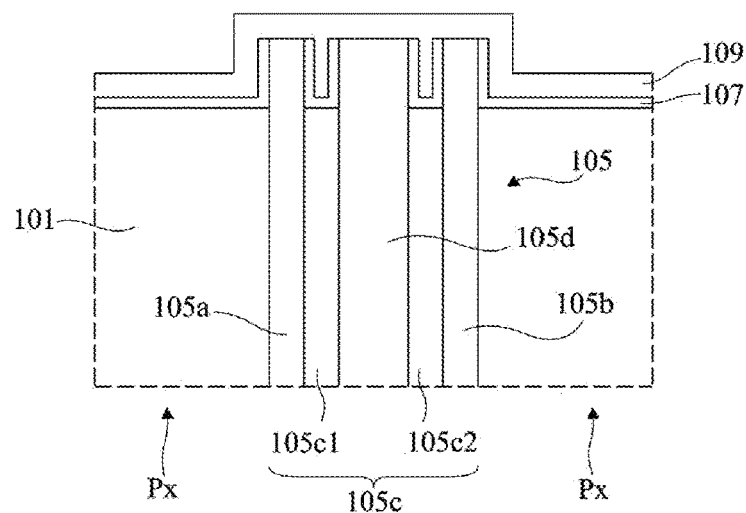
FIG. 9 illustrates another step of the manufacturing of a back-side illuminated image sensor according to an embodiment.

FIG. 9 illustrates a step of deposition of antireflection layer 109, for example, made of tantalum oxide, on the back side of the structure obtained at the end of the steps of FIGS. 3, 4, 5, 6, 7, and 8. More particularly, in this example, layer 109 is deposited on top of and in contact with the back side of passivation layer 107 opposite semiconductor layer 101 and conductor or semiconductor regions 105c1 and 105c2, and on top of and in contact with the back side of insulating walls 105a, 105b, and 105d. Antireflection layer 109 is for example continuously deposited all over the rear surface of the sensor. As an example, layer 109 is deposited by atomic layer deposition (ALD). More generally, any other conformal deposition method may be used. As an example, the thickness of antireflection layer 109 is in the range from 2 to 200 nm, for example, in the order of 47 nm.

Figure 10:
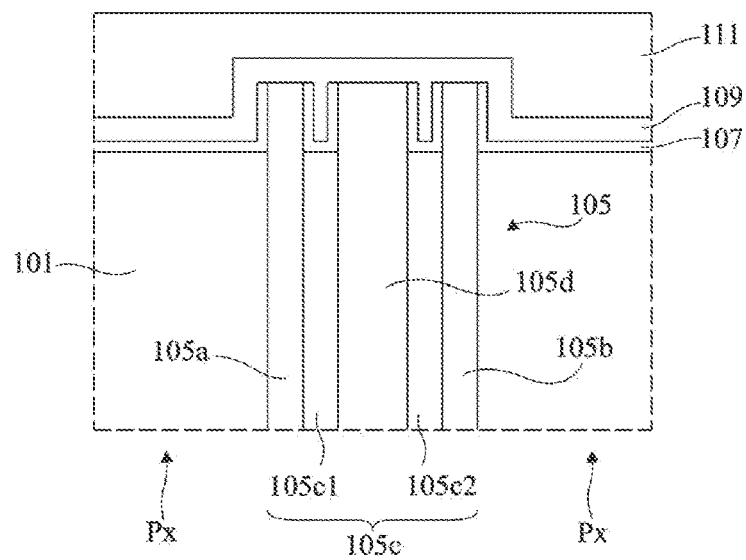
FIG. 10 illustrates another step of the manufacturing of a back-side illuminated image sensor according to an embodiment.

FIG. 10 illustrates a step of deposition of a protection insulating layer 111, for example, made of silicon oxide, on top of and in contact with the back side of antireflection layer 109. Protection layer 111 is for example continuously deposited over the entire rear surface of the sensor. As an example, the thickness of protection layer 111 is in the range from 15 to 400 nm.

As previously indicated, according to the needs of the application, other layers, not shown, may be provided on the back side of the sensor, for example, a filtering layer made of colored resin, a layer of microlenses, etc.

An advantage of the manufacturing method described in relation with FIGS. 3 to 10 and of the sensor obtained by this method is a significant decrease in the dark current detected by the sensor pixels.

A possible explanation of this advantage is that dielectric passivation layer 107 is not perfectly electrically insulating and may, in a structure of the type described in relation with FIG. 2, conduct parasitic electric charges from conductor or semiconductor regions 105c1 and 105c2 to the photodetection areas of the pixels formed in semiconductor layer 101. In a sensor of the type obtained by the method of FIGS. 3 to 10, the interruption of passivation layer 107 opposite the back side of the protruding portions of insulating walls 105a, 105b, and 105d enables to interrupt the conduction of parasitic charges via layer 107.

Figure 11:
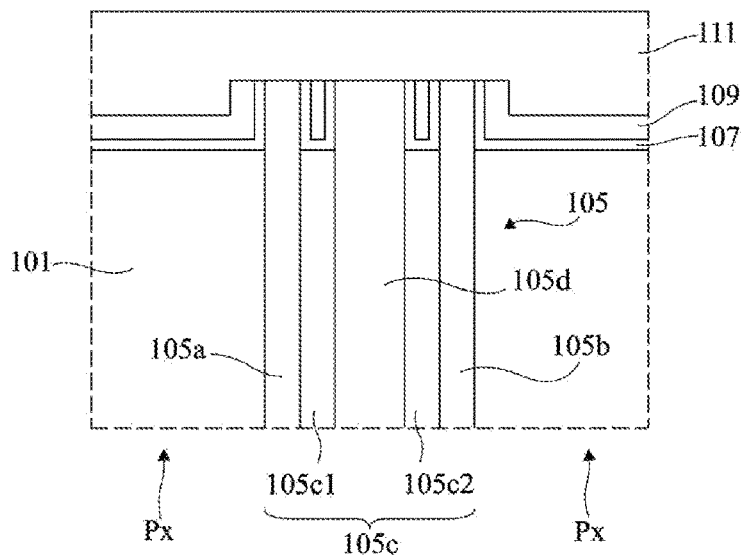
FIG. 11 illustrates an alternative embodiment of the method illustrated in FIGS. 3 to 10.

FIG. 11 is a partial simplified cross-section view illustrating an alternative embodiment of the method illustrated in FIGS. 3 to 10. FIG. 11 is a view in the same cross-section plane as FIGS. 3 to 10, showing the sensor obtained at the end of the method.

The method of FIG. 11 differs from the method of FIGS. 3 to 10 mainly in that, in the example of FIG. 11, antireflection layer 109 is deposited on the back side of passivation layer 107 before the deposition of sacrificial layer 201 (not shown in FIG. 11). Thus, during the step of planarization of the back side of the sensor (FIG. 7), passivation layer 107 and antireflection layer 109 are both interrupted opposite the back side of insulating walls 105a, 105b, and 105d. After the removal of sacrificial layer 201, protection layer 111 may be deposited on top of and in contact with the back side of antireflection layer 109 and on top of and in contact with the exposed portion of passivation layer 107 opposite semiconductor layer 101 and conductor or semiconductor regions 105c1 and 105c2, and on top of and in contact with the back side of insulating walls 105a, 105b, and 105d. In this variation, the material of sacrificial layer 201 is selected to be selectively etchable not only over the material of layer 107 and over the material of insulating walls 105a, 105b, and 105d, but also over the material of layer 109.

An advantage of the manufacturing method of FIG. 11 and of the sensor obtained by this method is that it enables to still further decrease the dark current by avoiding the conduction of parasitic charges from conductor or semiconductor regions 105c1 and 105c2 to semiconductor layer 101, via layer 109.

Figure 12A:
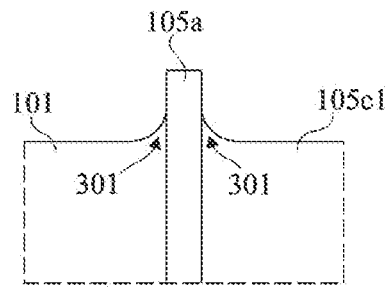
FIGS. 12A and 12B illustrate another alternative embodiment of the method illustrated in FIGS. 3 to 10.
Figure 12B:
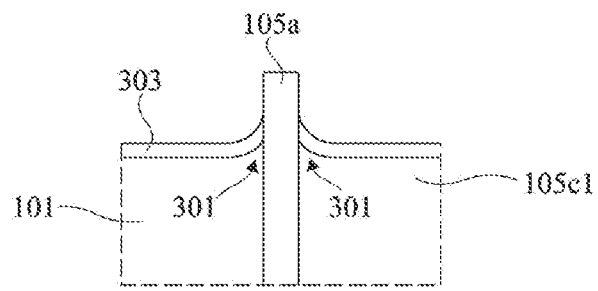

FIGS. 12A and 12B illustrate another variation of the method illustrated in FIGS. 3 to 10. Each of FIGS. 12A and 12B show an enlargement of a portion of the sensor, close to the back side of the sensor, at the level of an insulating wall 105a of the vertical capacitive insulation wall 105 of the sensor (corresponding to the portion delimited by a frame 12 in FIG. 4).

FIG. 12A shows the back side of the sensor at the end of the step of selective partial etching of layer 101 and of regions 105c1 and 105c2, described in relation with FIG. 4. As shown in FIG. 12A, it can be observed that in practice, the etching of layer 101 and of regions 105c1 and 105c2 is not perfectly uniform. More particularly, according to the type of method used for perform the etching, there may remain residues of the material of layer 101 and of regions 105c1 and 105c2 in the immediate vicinity of insulating walls 105a, 105b, and 105d, for example, due to a shadowing effect, to a selectivity effect, etc. This results in the forming, in layer 101 and/or in regions 105c1 and 105c2, of point-shaped or bird's beak structures 301, bearing on insulating walls 105a, 105b, and 105c.

FIG. 12B illustrates a step of oxidizing the back side of the structure obtained at the end of the steps of FIGS. 3 and 4, to form a relatively thick oxide layer 303, for example, in the range from 1 to 10 nm, for example, in the order of 5 nm, on the back side of semiconductor layer 101 and on the back side of regions 105c1 and 105c2 of capacitive insulation walls 105. As illustrated in FIG. 12B, this oxidation step results in significantly rounding, or even in suppressing, the points of bird's beak structures 301 at the interface with insulating walls 105a, 105b, and 105d. As an example, the oxidation step is carried out by submitting the back side of the sensor to an oxygen plasma, preferably at a temperature smaller than 400° C. to avoid damaging interconnection structure 103 of the sensor. As a variation, a chemical oxidation may be provided.

The rest of the method is for example identical or similar to what has been previously described in relation with FIGS. 5 to 10.

An advantage of the alternative embodiment of FIGS. 12A and 12B is that it enables to further improve the voltage behavior of the capacitive insulation walls of the sensor.

Of course, the alternative embodiments of FIGS. 11 and 12A and 12B may be combined.

Figure 13:
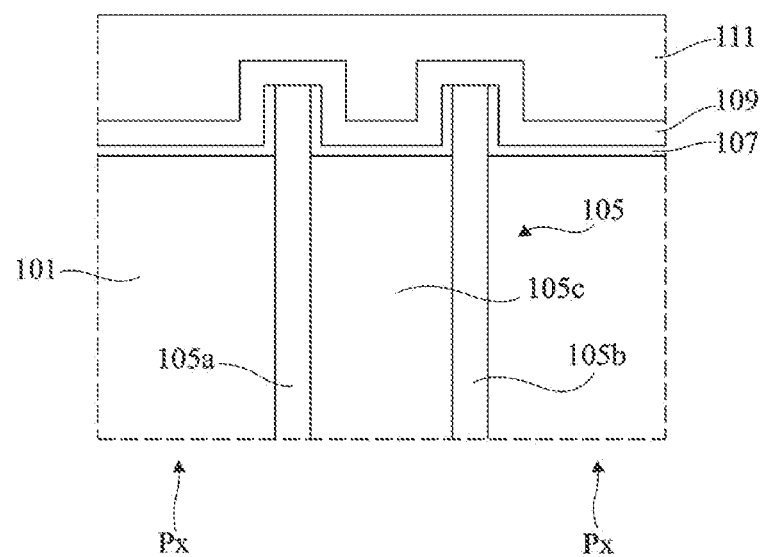
FIG. 13 is a partial simplified cross-section view illustrating another example of a back-side illuminated image sensor according to an embodiment.

FIG. 13 is a partial simplified cross-section view illustrating another example of a back-side illuminated image sensor according to an embodiment.

FIG. 13 is a view in the same cross-section plane as FIG. 10. The sensor of FIG. 13 shows elements common with the sensor of FIG. 10, and is formed by a manufacturing method similar to the method described in relation with FIGS. 3 to 10. In the following, only the differences with respect to the sensor of FIG. 10 will be detailed.

The sensor of FIG. 13 differs from the sensor of FIG. 10 mainly in that, in the example of FIG. 13, capacitive insulation walls 105 comprise no central insulating wall 105d. Thus, in the example of FIG. 13, regions 105c1 and 105c2 are combined in a single central conductive or semiconductor region 105c. In other words, each capacitive insulation wall 105 comprises two insulating walls 105a and 105b having their outer lateral surfaces in contact with semiconductor layer 101, and a conductor or semiconductor region 105c forming a single central wall having its lateral surfaces respectively in contact with the inner lateral surface of insulating wall 105a and with the inner lateral surface of insulating wall 105b.

Of course, the variation of FIG. 13 may be combined with the variation of FIG. 11 and/or with the variation of FIGS. 12A and 12B.

Various embodiments and variations have been described. It will be understood by those skilled in the art that certain features of these various embodiments and variations may be combined, and other variations will occur to those skilled in the art. In particular, the above-described embodiments are not limited to the examples of numerical dimensions or to the examples of materials mentioned in the present disclosure.

Such alterations, modifications, and improvements are intended to be part of this disclosure, and are intended to be within the spirit and the scope of the present disclosure. Accordingly, the foregoing description is by way of example only and is not intended to be limiting. The present disclosure is limited only as defined in the following claims and the equivalents thereto.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An image sensor, comprising:
   a semiconductor layer having a front side and a back side;
   a capacitive insulation wall extending from the front side to the back side of the semiconductor layer, the capacitive insulation wall including first and second insulating walls;
   a region of a conductive material extending between the first insulation wall and the second insulation wall, each of the first and second insulating walls having a portion protruding from the back side of the semiconductor layer and from a back side of the region of the conductive material; and
   a dielectric passivation layer coating the back side of the semiconductor layer and the back side of the region of the conductive material, a back side of the protruding portions of the first and second insulating walls being uncoated by the dielectric passivation layer.

2. The image sensor of claim 1, further comprising an antireflection layer coating a back side of the dielectric passivation layer and the back side of the protruding portions of the first and second insulating walls.

3. The image sensor of claim 2, further comprising a protection insulating layer covering a back side of the antireflection layer.

4. The image sensor of claim 1, further comprising an antireflection layer coating a back side of the dielectric passivation layer, the back side of the protruding portions of the first and second insulating walls being uncoated by the antireflection layer.

5. The image sensor of claim 4, further comprising a protection insulating layer covering a back side of the antireflection layer, the protection insulating layer contacting the back side of the protruding portions of the first and second insulating walls.

6. A device, comprising:
   a semiconductor layer having a first surface opposite to a second surface;
   a first insulating layer that extends from the first surface past the second surface of the semiconductor layer;
   a first conductive layer around the first insulating layer, the first conductive layer extending from the first surface to the second surface of the semiconductor layer;
   a second insulating layer around the first conductive layer, the second insulating layer extending from the first surface past the second surface of the semiconductor layer; and
   a dielectric passivation layer coating the second surface of the semiconductor layer and a back surface of the first conductive layer, the first and second insulating layers being uncoated by the dielectric passivation layer.

7. The device of claim 6 wherein the semiconductor layer is in direct contact with the second insulating layer.

8. The device of claim 7 wherein the first conductive layer is in direct contact with the second insulating layer.

9. The device of claim 8 wherein the first conductive layer is in direct contact with the first insulating layer.

10. The device of claim 6 wherein a first end of the first insulating layer and a second end of the second insulating layer extend past the second surface of the semiconductor layer.

11. The device of claim 10, further comprising a third insulating layer on the second surface of the semiconductor layer and on the first end and the second end.

12. A device, comprising:
   a first semiconductor layer having a first side and a second side;
   a first insulating layer extending from the first side of the first semiconductor layer past the second side of the first semiconductor layer;
   a second semiconductor layer adjacent to the first insulating layer, the second semiconductor layer extending from the first side of the first semiconductor layer to the second side of the first semiconductor layer;
   a second insulating layer adjacent to the second semiconductor layer, the second insulating layer extending from the first side of the first semiconductor layer past the second side of the first semiconductor layer, the end of the second semiconductor layer is not covered by the first and second insulating layers; and
   a dielectric passivation layer coating the second side of the first semiconductor layer and a back surface of the second semiconductor layer, the first and second insulating layers being uncoated by the dielectric passivation layer.

13. The device of claim 12, further comprising a third insulating layer on the second side of the first semiconductor layer, an outer surface of the first insulating layer and an outer surface of the second insulating layer remaining uncovered by the third insulating layer.

14. The device of claim 13, further comprising an anti-reflective layer on the third insulating layer.

15. The device of claim 14, further comprising a first recess between the first insulating layer and the second insulating layer that extend past the second side of the first semiconductor layer.

16. The device of claim 15 wherein the first recess includes a portion of the antireflective layer.

17. The device of claim 16, further comprising a fourth insulating layer on the antireflective layer.

* * * * *